(12) United States Patent
Sotani et al.

(10) Patent No.: US 7,078,733 B2
(45) Date of Patent: Jul. 18, 2006

(54) ALUMINUM ALLOYED LAYERED STRUCTURE FOR AN OPTICAL DEVICE

(75) Inventors: Naoya Sotani, Gifu (JP); Koji Suzuki, Aichi (JP); Yoshio Miyai, Oogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 139 days.

(21) Appl. No.: 10/383,058

(22) Filed: Mar. 7, 2003

(65) Prior Publication Data
US 2003/0168968 A1    Sep. 11, 2003

(30) Foreign Application Priority Data
Mar. 7, 2002  (JP)  ............... 2002-062670
Mar. 11, 2002  (JP)  ............... 2002-066143

(51) Int. Cl.
*H01L 33/00* (2006.01)
*H01J 1/62* (2006.01)

(52) U.S. Cl. ............... 257/98; 257/432; 257/762; 257/765; 257/768; 257/771; 313/503; 313/509

(58) Field of Classification Search ............... None
See application file for complete search history.

(56) References Cited

U.S. PATENT DOCUMENTS

| | | | |
|---|---|---|---|
| 3,662,210 A | 5/1972 | Maximov | |
| 5,517,080 A | 5/1996 | Budzilek et al. | |
| 5,543,745 A | 8/1996 | Notani | ............... 327/538 |
| 5,780,351 A | 7/1998 | Arita et al. | |
| 5,945,008 A | 8/1999 | Kisakibaru et al. | |
| 6,075,319 A | 6/2000 | Kanda et al. | |
| 6,093,934 A | 7/2000 | Yamazaki et al. | |
| 6,124,604 A | 9/2000 | Koyama et al. | |
| 6,281,552 B1 | 8/2001 | Kawasaki et al. | |
| 6,333,528 B1 | 12/2001 | Arita et al. | |
| 6,356,029 B1 | 3/2002 | Hunter | |
| 6,407,534 B1 | 6/2002 | Mukainakano | ............... 320/162 |
| 6,489,046 B1 | 12/2002 | Ikeda et al. | |
| 6,498,517 B1 | 12/2002 | Miyazaki | ............... 327/59 |
| 6,501,466 B1 | 12/2002 | Yamagishi et al. | |
| 6,525,704 B1 | 2/2003 | Kondo et al. | |
| 6,528,824 B1 | 3/2003 | Yamagata et al. | |

(Continued)

FOREIGN PATENT DOCUMENTS

JP    61-138259    8/1986

(Continued)

OTHER PUBLICATIONS

"Al—Mo (Aluminum—Molybdenum)" L.Brewer et al., *Binary Alloy Phase Diagrams* vol. 1 ed. Thaddeus B. Massalski, (Dec. 1980) pp. 133-134.

(Continued)

*Primary Examiner*—Alonzo Chambliss
(74) *Attorney, Agent, or Firm*—McDermott Will & Emery LLP

(57) ABSTRACT

A layered structure of wire(s) comprising a wiring layer made of a low resistance metal containing aluminum, copper or silver; and an alloy layer made of an intermediate phase containing the low resistance metal and a refractory metal. The refractory metal is molybdenum. There is also formed a layered structure of wire(s) made of an aluminum alloy containing a lanthanoid, wherein a number average crystal grain size is 16.9 nm or more. Crystal grain size may be larger than a mean free path of electrons to provide a layered structure of wire(s) with a reduced resistance.

5 Claims, 9 Drawing Sheets

U.S. PATENT DOCUMENTS

| | | | |
|---|---|---|---|
| 6,579,787 B1 | 6/2003 | Okura et al. | |
| 6,583,581 B1 | 6/2003 | Kaneko et al. | |
| 6,686,693 B1 | 2/2004 | Ogawa | |
| 6,717,181 B1 | 4/2004 | Murakami et al. | |
| 6,747,290 B1* | 6/2004 | Yamazaki et al. | 257/59 |
| 6,770,518 B1* | 8/2004 | Yamazaki et al. | 438/166 |
| 6,781,746 B1 | 8/2004 | Yamazaki et al. | |
| 6,794,675 B1* | 9/2004 | Suzuki et al. | 257/40 |
| 2001/0055830 A1* | 12/2001 | Yoshimoto | 438/48 |
| 2002/0009818 A1* | 1/2002 | Yoshimoto | 438/30 |
| 2002/0084840 A1 | 7/2002 | Tsuchi | 327/563 |
| 2002/0093472 A1 | 7/2002 | Numao | 345/87 |
| 2002/0126073 A1 | 9/2002 | Knapp et al. | 345/46 |
| 2002/0190256 A1 | 12/2002 | Murakami et al. | |
| 2003/0124042 A1 | 7/2003 | Nakazawa et al. | |
| 2003/0129321 A1 | 7/2003 | Aoki | |
| 2005/0116229 A1* | 6/2005 | Yoshimoto | 257/66 |

FOREIGN PATENT DOCUMENTS

| | | |
|---|---|---|
| JP | 63-250873 | 10/1988 |
| JP | 02-039536 | 2/1990 |
| JP | 5-249916 | 9/1993 |
| JP | 08-54836 | 2/1996 |
| JP | 08-129358 | 5/1996 |
| JP | 10-032202 | 2/1998 |
| JP | 10-163132 | 6/1998 |
| JP | 10-170955 | 6/1998 |
| JP | 10-199827 | 7/1998 |
| JP | 10-275683 | 10/1998 |
| JP | 10-319872 | 12/1998 |
| JP | 11-111990 | 4/1999 |
| JP | 11-219146 | 8/1999 |
| JP | 11-260562 | 9/1999 |
| JP | 2000-221903 | 8/2000 |
| JP | 2000-236097 | 8/2000 |
| JP | 2000-277607 | 10/2000 |
| JP | 2000-347621 A | 12/2000 |
| JP | 2000-349298 A | 12/2000 |
| JP | 2001-56667 | 2/2001 |
| JP | 2001-308094 A | 2/2001 |
| JP | 2001-60076 | 3/2001 |
| JP | 2001-109395 | 4/2001 |
| JP | 2001-122884 | 5/2001 |
| JP | 2001-244076 | 9/2001 |
| JP | 2001-282136 | 10/2001 |
| JP | WO 01/75852 A1 | 10/2001 |
| JP | 2001-326079 | 11/2001 |
| JP | 2001-350449 | 12/2001 |
| JP | 2001-357972 | 12/2001 |
| JP | 2002-012861 | 1/2002 |
| JP | 2002-040963 A | 2/2002 |
| JP | 2002-318553 | 10/2002 |
| JP | 2003-168570 | 6/2003 |
| JP | 2003-195811 | 7/2003 |
| WO | WO 97/36324 | 10/1997 |
| WO | WO98/36407 | 8/1998 |
| WO | WO 98/36407 | 8/1998 |
| WO | WO 98/45881 | 10/1998 |
| WO | WO 01/06484 A1 | 1/2001 |

OTHER PUBLICATIONS

Office Action for corresponding Japanese Application No. 2002-066143 (w/English Translation) Reference No.: NBC 1022028 Dispatch No. 309284 Dispatch Date: Aug. 23, 2005 Patent Application No. 2002-066143 Drafting Date: Aug. 17, 2005 Examiner of JPO: Ken, Haseyama 9171 4M00 Title of Invention: Structure of Wires Applicant: Sanyo Electric Co., Ltd. Representative: Sakaki Morishita.

Japanese Office Action issued in Application No. 2002-017727.

Japanese Office Action issued in Application No. 2002-065578.

US Office Action dated Jun. 2, 2005 for related Application No. 10/354,183 (65933-016).

Chinese Office Action issued in Application No. 02159777.4 Dispatch Date: Jan. 6, 2006.

* cited by examiner

| PARTICLE SIZE (nm) | COUNT |
|---|---|
| 25~30 | 6 |
| ~40 | 8 |
| ~50 | 12 |
| ~60 | 18 |
| ~70 | 20 |
| ~80 | 16 |
| ~90 | 13 |
| ~100 | 10 |
| ~110 | 9 |
| ~120 | 3 |
| ~130 | 0 |
| ~140 | 2 |
| ~150 | 0 |
| ~160 | 1 |

ALUMINUM ALLOYED LAYERED STRUCTURE FOR AN OPTICAL DEVICE

BACKGROUND OF THE INVENTION

1. Field of the Invention

The present invention relates to a layered structure of wire(s), a manufacturing method therefor, and an optical apparatus.

2. Description of the Related Art

A display employing a current driven organic EL (OLED: Organic Light Emitting Diode) device which acts as a light emitting diode has attracted attention as an alternative to a CRT or LCD.

In an optical element in an organic EL display, layered structure of wire(s) used as power supply lines must be highly reliable; specifically, it must have a lower resistance and be resistant to whiskers/hillocks, electromigration and stress migration. For reducing a resistance, a low-resistance metal such as aluminum is used as a wiring material.

A protective layer made of a refractory metal such as molybdenum may be formed on a wiring made of a low-resistance metal such as aluminum to improve resistance to whiskers/hillocks. Furthermore, resistance to electromigration may be improved by using an aluminum alloy containing at least one of lanthanoide series such as neodymium as a wiring material.

A layered structure of wire(s) employed in an organic EL must have a particularly lower resistance for preventing voltage drop. However, when using an aluminum alloy containing neodymium as a wiring material, the layered structure of wire(s) exhibits a higher specific resistance than that made of aluminum alone. Furthermore, forming a protective layer made of molybdenum may lead to a higher specific resistance.

Furthermore, when coating a layered structure of wire(s) made of a low-resistance metal with a protective layer made of a refractory-temperature metal, adherence between these layers may be deteriorated and a contact resistance may be undesirably increased. In particular, when a lattice type of the refractory metal is different form that of the low resistance metal, these layers cannot be matched, resulting in delamination. When forming a layered structure of wire(s) on an amorphous substrate, each layer exhibits a random crystal orientation so that interlayer adherence may be more seriously reduced.

SUMMARY OF THE INVENTION

The present invention has been made in view of the foregoing circumstances and an objective therefor is to provide a highly reliable layered structure of wire(s) with a reduced resistance. Another object of the present invention is to provide a layered structure of wire(s) with improved electromigration resistance. Another objective of the present invention is to provide a layered structure of wire(s) with improved stress migration resistance. Further objective of the present invention is to provide a layered structure of wire(s) with improved durability. Further objective of the present invention is to improve an yield in a method of manufacturing a layered structure of wire(s).

According to the present invention, there is provided a layered structure of wire(s) made of an aluminum alloy containing a lanthanoid, wherein the crystal of the alloy has an average crystal grain size of 16.9 nm or more. An average crystal grain size herein is a number average crystal grain size calculated by dividing the total sizes of the individual particles in the alloy by the total number of the particles.

A number average crystal grain size may be about 16.9 nm or more, which is a mean free path of electrons in aluminum, to reduce a probability of diffusion of electrons in a grain boundary and therefore to reduce a specific resistance of the layered structure of wire(s).

A number average crystal grain size may be 60 nm or more. A number average crystal grain size of three folds or more of the electron mean free path may further reduce a specific resistance of a layered structure of wire(s).

According to the present invention, there is provided a layered structure of wire(s) made of an aluminum alloy containing a lanthanoid, wherein 90% of the total crystals in the alloy are those having a crystal grain size of 30 nm or more. A crystal grain size may be larger than the electron mean free path to reduce a specific resistance of a layered structure of wire(s).

The lanthanoid may be neodymium (Nd). The content of neodymium in the alloy is preferably 1 atomic % or more, more preferably 2 atomic % or more, for improving electromigration resistance. On the other hand, the upper limit is preferably 10 atomic %, more preferably 5 atomic % for improving electromigration resistance while maintaining a low specific resistance of a wiring layer. Thus, the layered structure of wire(s) may become highly reliable.

According to the present invention, there is provided an optical apparatus comprising a circuit comprising a current driven optical element and the above layered structure of wire(s) connected to the circuit. Herein, the optical element may be an organic EL element. The circuit comprising an optical element may be an organic EL element itself, or alternatively may comprise, in addition to an organic EL element, a thin film transistor (TFT) for driving the organic EL element. When the circuit comprises a TFT, the layered structure of wire(s) may be connected to the TFT.

The optical apparatus may have a plurality of circuits and the layered structure of wire(s) may be connected to the plurality of circuits so that it is used as a power line for supplying power to each circuit. Herein, the optical apparatus may be an active matrix type display. A large current may pass through the power line for supplying a power to each circuit, which tends to cause migration particularly at contacts. A layered structure of wire(s) according to the present invention is highly migration resistant and highly reliable. It may be, therefore, used as a power line for an optical apparatus to consistently and uniformly supply a power from a contact to each circuit. Thus, dispersion of a voltage supplied to each circuit can be prevented, allowing stabled is play with reduced unevenness in a luminance.

The layered structure of wire(s) may be connected to a current driven optical element. The layered structure of wire(s) configured as described above is useful when it is applied to a current driven optical element.

According to the present invention, there is provided a method of manufacturing a layered structure of wire(s). The method comprises depositing an aluminum alloy containing a lanthanoid on the top surface of a substrate heated to 50° C. to 150° C. both inclusive by sputtering using the alloy as a target wherein the sputtering process is conducted maintaining the substrate and the target under a reduced pressure of $0.18/(M^{1/2} \times d)$ Pa or less in which M is the atomic weight of the target metal and d is a distance between the substrate and the target. The term "atomic weight" as used herein refers to an average atomic weight or the smallest atomic weight in main component metals when a target metal is an alloy. This method allows a number average crystal grain size to be larger than the mean free path of electrons, resulting in providing a layered structure of wire(s) with a reduced resistance. An intervening layer may be present between the substrate and the layered structure of wire(s).

After depositing the wiring layer, the layered structure of wire(s) may be heated to a temperature from the heating temperature of the substrate during the sputtering process to 450° C. both inclusive. Such heating may further reduce a resistance of the layered structure of wire(s).

According to the present invention, there is provided a display apparatus comprising a layered structure of wire(s) made of an aluminum alloy containing a lanthanoid wherein a number average crystal grain size is 16.9 nm or more. A number average crystal grain size may be at least a mean free path of electrons, to reduce a probability of diffusion of electrons in a grain boundary and therefore to reduce a specific resistance of the layered structure of wire(s).

The display apparatus may comprise an optical element and a driving transistor therefor. The layered structure of wire(s) may be connected to the optical element or the driving transistor. The layered structure of wire(s) configured as above may be useful when being applied to a layered structure of wire(s) for supplying a current to, for example, an optical element or driving transistor in a display apparatus.

According to the present invention, there is provided a layered structure of wire(s) comprising a wiring layer made of a metal containing aluminum, copper or silver; and an alloy layer made of an intermediate phase containing the metal constituting the wiring layer and a refractory metal which is adjacent to the wiring layer. The metal constituting the wiring layer may be an elemental metal such as aluminum, copper or silver, or an alloy containing 1 to 99% of aluminum, copper or silver. The metal constituting the wiring layer may have a lower specific resistance than the refractory metal. Hereinafter, a metal constituting the wiring layer is referred to as a "low resistance metal".

When two metals having different crystal structures may form a solid solution, the preferential regions for these crystal structures depend on a specific alloy. Between these metals, there may sometimes generate a composition region which is known as an intermediate phase exhibiting a crystal structure different from that of either component metal. An intermediate phase exhibiting particularly less metallicity is called as an intermetallic compound while an intermediate phase exhibiting prominent metallicity is called as a secondary solid solution. In an intermetallic compound, a ratio of the atom numbers of component metals is a relatively simple integer and the atomic position of the crystal lattice is fixed.

The intermediate phase may be an intermetallic compound. Generally, an intermetallic compound exhibits covalent bond properties, and is thus characterized by brittleness and a small diffusion coefficient while having a large electric resistance. Since an intermetallic compound is hard, the layered structure of wire(s) may have an alloy layer as an intermetallic compound over and/or under a wiring layer to protect the wiring layer from external stress, resulting in improved stress migration resistance.

According to the present invention, there is provided a layered structure of wire(s) comprising a wiring layer made of a low resistance metal containing aluminum, copper or silver; a protective layer made of a refractory metal; and an alloy layer made of an intermediate phase containing the low resistance metal and the refractory metal between and adjacent to the wiring and the protective layers. The alloy layer formed between the wiring and the protective layers may prevent diffusion of a metal from the wiring layer to the protective layer, and is thus effective for minimizing migration. In addition, the alloy layer formed between the wiring and the protective layers may improve adherence between these layers. Improvement in adherence between the wiring and the protective layers may then reduce an interlayer contact resistance. Furthermore, since an intermetallic compound can prevent diffusion, formation of an alloy layer between the refractory metal and the low resistance metal may be prevented when the intermediate phase is an intermetallic compound. Thus, a thin and even alloy layer may be formed.

According to the present invention, there is provided a layered structure of wire(s) comprising a wiring layer made of a low resistance metal containing aluminum, copper or silver; a protective layer made of a refractory metal; and an alloy layer between and adjacent to the wiring and the protective layers in which a composition of the low resistance metal and the refractory metal is gradually changed. Such an alloy layer between the wiring and the protective layers may improve adherence between these layers. The alloy layer is not limited to the above one in which a composition of the low resistance metal and the refractory metal is gradually changed, but may be one in which a composition of the metals is discontinuously changed.

Examples of a refractory metal include those comprising a Group 6A element such as molybdenum (Mo), chromium (Cr) and tungsten (W); or a Group 5A element such as tantalum (Ta), vanadium (V) and niobium (Nb). Such a protective layer may improve whisker/hillock resistance of the layered structure of wire(s). In particular, a Group 6A element has a feature of reduced diffusion into the low resistance metal.

Examples of a refractory metal include those containing a metal such as molybdenum, chromium, tungsten, tantalum, vanadium or niobium whose lattice type is body centered cubic (bcc). Examples of a low resistance metal include those containing a metal such as aluminum (Al), copper (Cu), silver (Ag), gold (Au), rhodium (Rh), iridium (Ir), nickel (Ni), platinum (Pt) and palladium (Pd) whose lattice type is face centered cube (fcc). As described above, an alloy layer may be formed between metal layers having different lattice types to improve adherence between these metal layers and thus to improve an yield in a method of manufacturing a layered structure of wire(s). The lattice patterns cited above are those described as general states at room temperature in textbooks.

The refractory metal preferably contains molybdenum. Since molybdenum exhibits good adherence to a substrate, it may improve overall adherence of the layered structure of wire(s) and therefore, contribute to improvement in an yield. Furthermore, molybdenum has a feature that it can be easily processed in a manufacturing process.

The low resistance metal may contain aluminum. Aluminum is highly reactive. Therefore, when the wiring layer is made of the low resistance metal containing aluminum, an intermediate phase can be readily formed between the wiring layer and the refractory metal.

The wiring layer may further contain neodymium and the intermediate phase may further contain neodymium. Furthermore, the wiring layer and the intermediate phase may contain a lanthanoid. The neodymium content in the wiring layer may be preferably 1 atomic % or more, more preferably 2 atomic % or more, to improve electromigration resistance. On the other hand, the upper limit may be preferably 10 atomic %, more preferably 5 atomic %, to improve electromigration resistance while maintaining a low specific resistance of the wiring layer. Another lanthanoid exhibiting substantially equivalent chemical properties to neodymium may be similarly effective.

The thickness of the alloy layer may be preferably 1 nm or more, more preferably 10 nm or more, to improve adherence between the wiring and the protective layers. On the other hand, the upper limit may be preferably 50 nm, more preferably 15 nm. An intermetallic compound is poorly electroconductive. Therefore, when the layer is thick, a vertical resistance, i.e., a contact resistance is increased. When forming an intermetallic compound by an interface reaction, a film thickness of the low resistance metal is reduced, leading to increase in a wiring resistance. Furthermore, when a brittle intermetallic compound is formed to a large thickness, the layered structure of wire(s) may have cracks, which may cause breaking. The intermetallic compound must be formed as a thin film between the refractory metal and the low resistance metal. The alloy layer may be formed to a film thickness of preferably 1 nm or more, more preferably 10 nm and preferably 50 nm or less, more preferably 15 nm or less, to solve the above problems for advantageously improving stress migration resistance, electromigration resistance and adherence. Thus, reliability of the layered structure of wire(s) can be improved.

The layered structure of wire(s) may be connected to a current driven optical element. A layered structure of wire(s) configured as described above is useful when being applied to a current driven optical element.

According to the present invention, there is provided an optical apparatus comprising a circuit comprising a current driven optical element and the above layered structure of wire(s) connected to the circuit. Herein, the optical element may be an organic EL element. The circuit comprising the optical element may be the organic EL element itself or may comprise, in addition to the organic EL element, a thin film transistor (TFT) for driving the organic EL element. When the circuit comprises a TFT, the layered structure of wire(s) may be connected to the TFT.

The optical apparatus may have a plurality of circuits and the layered structure of wire(s) may be connected to the plurality of circuits so that it is used as a power line for supplying power to each circuit. Herein, the optical apparatus may be an active matrix type display. A layered structure of wire(s) according to the present invention has a lower contact resistance and is highly reliable. It may be, therefore, used as a power line for a display to prevent dispersion of a voltage supplied to each circuit, allowing stable display with reduced unevenness in a luminance.

According to the present invention, there is provided a method of manufacturing a layered structure of wire(s) comprising forming a protective layer on the top surface of a substrate heated to 50° C. to 150° C. both inclusive by sputtering using a refractory metal containing molybdenum as a target and forming a wiring layer on the protective layer while heating the substrate to 50° C. to 150° C. both inclusive by sputtering using a low resistance metal containing aluminum, copper or silver as a target, wherein the forming the protective layer and forming the wiring layer are conducted under a reduced pressure of $0.18/(M^{1/2} \times d)$ Pa or less in which M is the atomic weight of the target metal or, when the target metal is an alloy, an average in atomic % of the atomic weights of component metals or the smallest atomic weight in main component metals and d is a distance between the substrate and the target; and the forming the wiring layer is conducted without exposing the substrate to the air. According to this method, an intermediate phase can be formed between the protective layer and the wiring layer to consistently produce the layered structure of wire(s). Furthermore, adherence between the protective layer and the wiring layer may be improved and an yield in a method of manufacturing the layered structure of wire(s) may be improved. Herein, an intervening layer may be disposed between the substrate and the protective layer.

This method may further comprise heating the layered structure of wire(s) to a temperature from the heating temperature of the substrate during the sputtering process to 450° C. both inclusive after forming the wiring layer. Such heating may reduce a resistance of the layered structure of wire(s).

According to the present invention, there is also provided a method of manufacturing a layered structure of wire(s) comprising forming a wiring layer on the top surface of a substrate heated to 50° C. to 150° C. both inclusive by sputtering using a low resistance metal containing aluminum, copper or silver as a target and forming a protective layer on the wiring layer while heating the substrate to 50° C. to 150° C. both inclusive by sputtering using a refractory metal containing molybdenum as a target, wherein the forming the protective layer and forming the wiring layer are conducted under a reduced pressure of $0.18/(M^{1/2} \times d)$ Pa or less in which M is the atomic weight of the target metal or, when the target metal is an alloy, an average in atomic % of the atomic weights of component metals or the smallest atomic weight in main component metals and d is a distance between the substrate and the target; and the forming the protective layer is conducted without exposing the substrate to the air. According to this method, an intermediate phase can be formed between a wiring and a protective layers to consistently produce a layered structure of wire(s). Furthermore, adherence between the wiring layer and the protective layer may be improved and an yield in a method of manufacturing the layered structure of wire(s) may be improved. Herein, an intervening layer may be disposed between the substrate layer and the wiring layer.

This method may further comprise heating the layered structure of wire(s) to a temperature from the heating temperature of the substrate during the sputtering process to 450° C. both inclusive after forming the protective layer. Such heating may reduce a resistance of the layered structure of wire(s).

According to the present invention, there is also provided a method of manufacturing a layered structure of wire(s) comprising forming a wiring layer on the top surface of a substrate by sputtering using a low resistance metal containing aluminum, copper or silver as a target and forming a protective layer by sputtering using a refractory metal containing molybdenum as a target such that the protective layer is formed in contact with the wiring layer, wherein the forming the wiring layer and forming the protective layer are conducted under the conditions with a substantially equivalent particle collision parameter represented by $P \times M^{1/2} \times d$ where P is a sputtering pressure, M is the atomic weight of the target metal or, when the target metal is an alloy, an average in atomic % of the atomic weights of component metals or the smallest atomic weight in main component metals and d is a distance between the substrate and the target. The term "atomic weight" as used herein refers to an average atomic weight or the smallest atomic weight in main component metals when a target metal is an alloy. Substantially equivalent conditions are, for example, those where a particle collision parameter ratio is 0.9 to 1.1 both inclusive.

Thus, the wiring layer and the protective layer may be formed by sputtering under the conditions with a substantially equivalent particle collision parameter to consistently form an intermediate phase.

The present invention also encompasses as effective aspects any appropriate combination of the elements described above and any expression in the present invention where a method and/or an apparatus are varied.

DETAILED DESCRIPTION OF PREFERRED EMBODIMENTS

The invention will now be described based on preferred embodiments which do not intend to limit the scope of the present invention but exemplify the invention. All of the features and the combinations thereof described in the embodiment are not necessarily essential to the invention.

Figure 1:
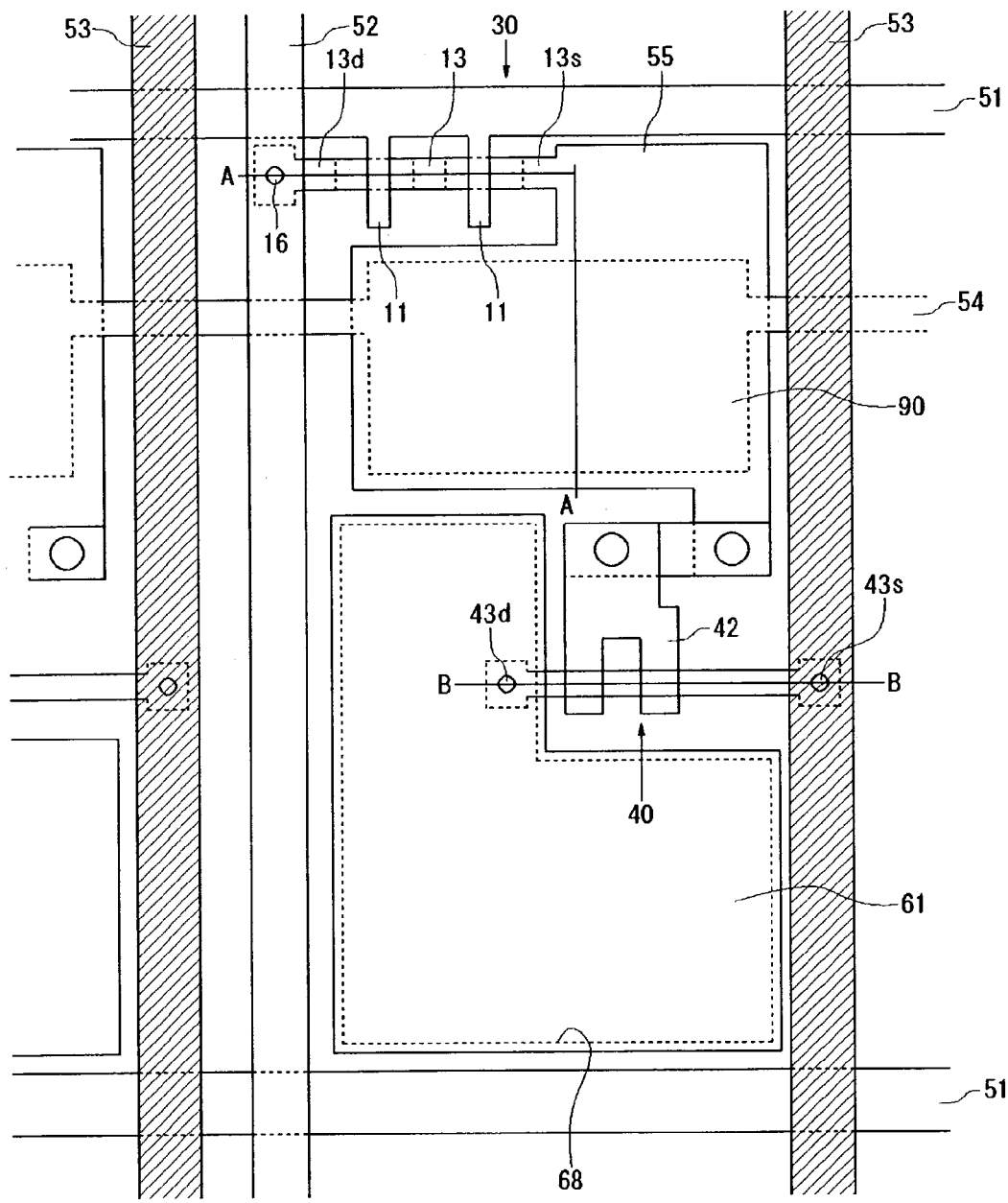
FIG. 1 is a plan view illustrating one pixel in an organic EL display.

A layered structure of wire(s) according to the present embodiment is used in an active matrix type organic EL display. FIG. 1 is a plan view illustrating a configuration of one of pixels in this display. In FIG. 1, a configuration of only one pixel is shown, but an active matrix type display has a number of the same pixels illustrated as a matrix, in which each pixel has a switching element.

A pixel is formed in a region surrounded by a gate signal line 51 and a drain signal line 52. The pixel has a first TFT 30 as a switching element, a second TFT 40 for driving an organic EL element, and a capacitor 90.

The first TFT 30 comprises a gate electrode 11 connected to the gate signal line 51 and to which a gate signal is sent, a drain electrode 13d connected to the drain signal line 52 and to which a drain signal is sent, and a source electrode 13s connected to the second TFT 40 via one of electrodes 55 in the capacitor 90.

One of the electrodes 55 in the capacitor 90 is integrally molded with the source electrode 13s in the first TFT. The other of the electrodes 54 in the capacitor 90 is made of, for example, chromium, and stores a charge between it and the electrode 55 via a gate insulating film. The capacitor 90 retains a voltage applied to the gate electrode 42 in the second TFT 40.

The second TFT 40 comprises a gate electrode 42 connected to the source electrode 13s in the first TFT 30, a drain electrode 43d connected to an anode 61 in an organic EL element 60, and a source electrode 43s connected to a driving power line 53.

Figure 2A:
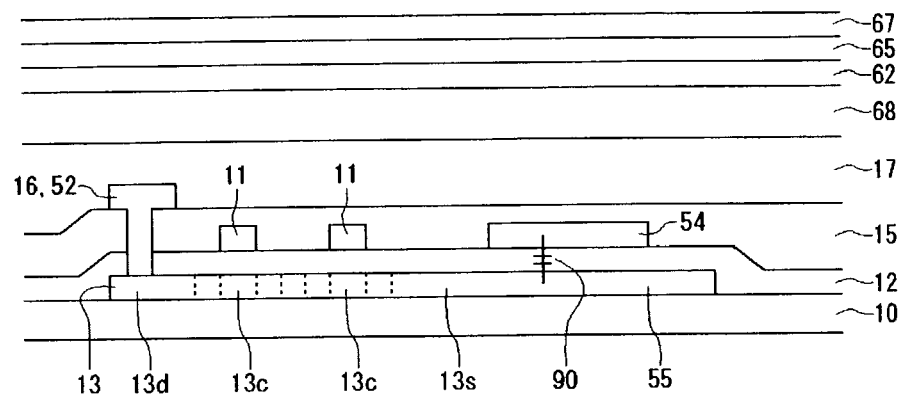
FIG. 2A shows a cross section on line A—A in the pixel illustrated in FIG. 1.
Figure 2B:
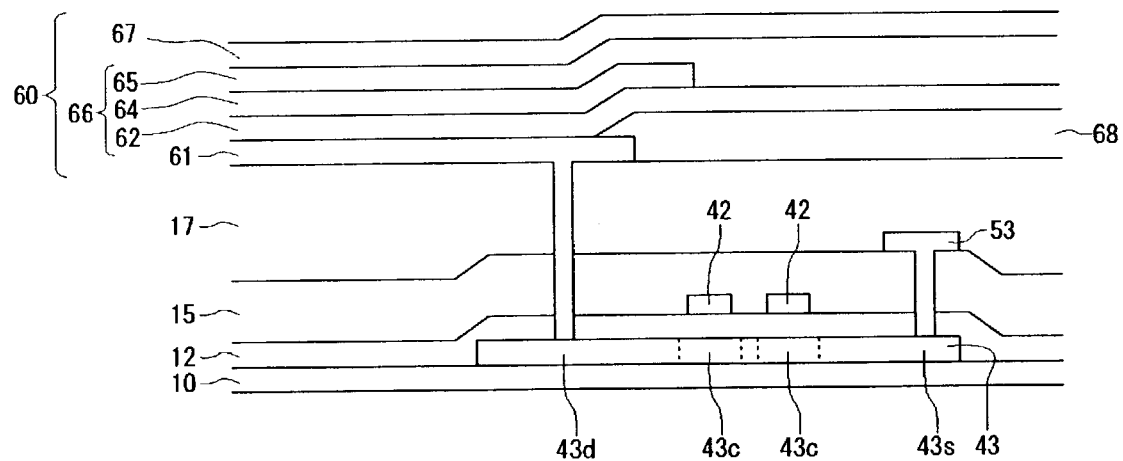
FIG. 2B shows a cross section on line B—B in the pixel illustrated in FIG. 1.

FIG. 2A shows a cross section on line A—A in FIG. 1 while FIG. 2B shows a cross-section on line B—B in FIG. 1. As illustrated in FIG. 2A, an active layer 13 is formed on an insulating substrate 10. The insulating substrate 10 may be made of, for example, quartz glass or non-alkali glass. The active layer 13 may be made of a polycrystalline silicon (p-Si) film formed by polycrystallizing by irradiation of amorphous silicon (a-Si) film with laser beam. In this figure, a top gate structure is illustrated, but the present invention is not limited to the specific structure. The active layer 13 comprises a source electrode 13s and a drain electrode 13d on both sides of two channels 13c. In this embodiment, the source electrode 13s and the drain electrode 13d are ion-doped with an n-type dopant, and the first TFT 30 is of an n-channel type.

Over the active layer 13 is formed a gate insulating film 12, over which is then formed the gate electrode 11, and one of the electrodes 54 in the capacitor 90. The gate electrode 11 may be made of a refractory metal such as chromium and molybdenum, and constitutes a part of the gate signal line 51 illustrated in FIG. 1.

Over the whole surface of the gate electrode 11 and the gate insulating film 12 is formed an interlayer insulating film 15 consisting of a SiN film and an $SiO_2$ film. A contact hole formed in relation to the drain electrode 13d is filled with a metal such as aluminum to form a drain extraction electrode 16 constituting a part of the drain signal line 52.

As illustrated in FIG. 2B, an active layer 43 is formed on the insulating substrate 10. The active layer 43 may be made of the same material as the active layer 13. In the active layer 43 is formed the channel 43c, on both side of which are formed a source electrode 43s and the drain electrode 43d. In this embodiment, the source electrode 43s and the drain electrode 43d are ion-doped with a p-type dopant and the second TFT 40 is of a p-channel type.

Over the active layer 43 is formed the gate insulating film 12, over which is then formed the gate electrode 42. The gate electrode 42 is made of a refractory metal such as chromium and molybdenum. The gate electrode 42 is connected to the source electrode 13s in the first TFT 30. In the active layer 43, the channel 43c is formed under the gate electrode 42.

Over the whole surface of the gate insulating film 12 and the gate electrode 42 is formed the interlayer insulating film 15. A contact hole formed in relation to the source electrode 43s is filled with a metal such as aluminum to form the driving power line 53. A method of forming the driving power line 53 will be described later.

Over the whole surface of the interlayer insulating film 15, the drain extraction electrode 16 (shown in FIG. 2A) and the driving power line 53 is formed a planarized insulating film 17 made of, for example, an organic resin. On the planarized insulating film 17 is formed the organic EL element 60. The organic EL element 60 has a structure where an anode 61, a light emitting element layer 66 and a cathode 67 are deposited in sequence. The anode 61 is connected to the drain electrode 43d via a contact hole formed in relation to the drain electrode 43d in the planarized insulating film 17. On the anode 61 is formed an insulating film 68. The insulating film 68 is formed for preventing short-circuit between the cathode 67 and the anode 61 caused by a break in a light emitting element layer 66 due to a step generated from a thickness of the anode 61.

Examples of a material for the anode 61 include Indium-Tin-Oxide (ITO), tin oxide ($SnO_2$) and indium oxide ($In_2O_3$). Generally, ITO is used because of its hole-injection effectiveness and a low surface resistance. Examples of a material for the cathode 67 include an aluminum alloy containing a trace amount of lithium, a magnesium-indium alloy, and a magnesium-silver alloy. The light emitting element layer 66 has a structure where a hole transport layer 62, a light-emitting layer 64 and an electron transport layer 65 are deposited in sequence. Examples of a material for the hole transport layer 62 include 4,4',4"-tris(3-methylphenylphenylamino)triphenylamine (MTDATA), N,N'-Di(naphthalene-1-yl)-N,N'-diphenyl-benzidine (NPB) and N,N'-diphenyl-N,N'-di(3-methylphenyl)-1,1'-biphenyl-4,4'-di amine (TPD). Examples of a material for the light-emitting layer 64 include a bis(benzoquinolinolato)beryllium complex comprising a quinacridone derivative (bis(10-hydroxybenzo[h]quinolinolato) beryllium:Bebq2) and an aluminum-quinolene complex (Alq3). Examples of a material for the electron transport layer 65 include Bebq2 and Alq3.

The hole transport layer 62, the electron transport layer 65 and the cathode 67 are formed such that they are shared by a plurality of the organic EL elements 60 in each pixel. The light-emitting layer 64 is formed as an island in response to the anode 61.

The above configurations and materials for a pixel are only illustrative and do not limit the scope of the present invention. For example, the first TFT 30 and the second TFT 40 may be of an n-channel type, a p-channel type or even a combination of an n-channel and a p-channel types. In the first TFT 30, the part consisting of the drain electrode 13d and the source electrode 13s may be replaced with a source electrode and a drain electrode in response to a voltage applied, respectively. The organic EL element 60 may have a structure where the anode 61, the light emitting element layer 66 and the cathode 67 are deposited in reverse. An intervening layer may be formed between layers.

There will be described operation for light-emitting of the organic EL element in a pixel thus configured. On applying a gate signal from the gate signal line 51 to the gate electrode 11, the first TFT 30 is turned on. Thus, the charge applied from the source electrode 13s in the first TFT 30 is stored in the capacitor 90 while being applied to the gate electrode 42 in the second TFT 40. To the organic EL element 60, a current in response to the voltage applied to the gate electrode 42 in the second TFT 40 is fed from the driving power line 53.

In the organic EL element 60, holes injected from the anode 61 and electrons injected from the cathode 67 are recombined inside of the light-emitting layer 64 to excite the organic molecules constituting the light-emitting layer 64 for generating excitons. In the course of energy-emitting inactivation of the excitons, the light-emitting layer 64 emits a light, which is discharged via the transparent anode 61 and is perceived as light-emission of the organic EL element 60.

Features of the present invention will be described according to the pixel structure for the organic EL display illustrated above. In one embodiment of the present invention, layered structure of wire(s) such as signal lines, scanning lines and driving power lines connected to a TFT in each pixel in the organic EL display are made of a low resistance metal and has a multilayer structure in which crystals in a low resistance metal alloy have a larger crystal grain size than a mean free path of electrons.

Figure 3:
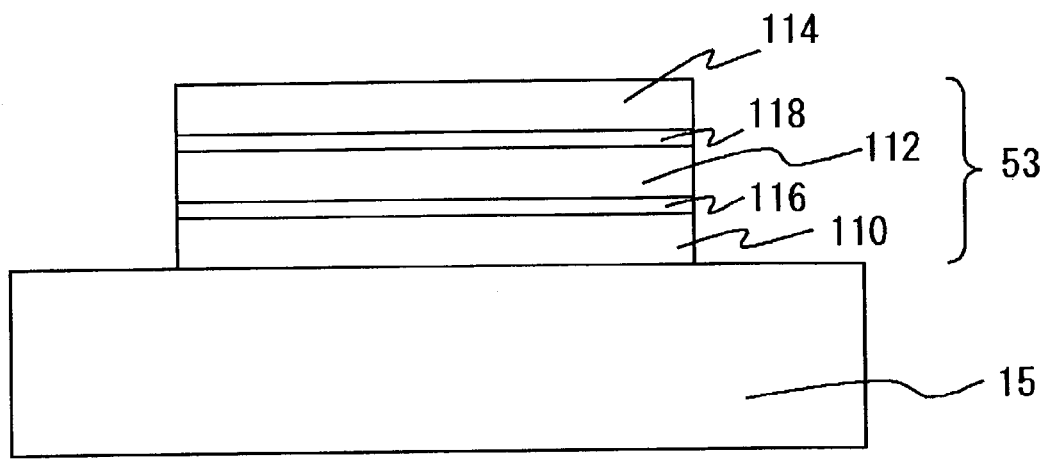
FIG. 3 is a cross-section of a layered structure of wire(s) having a multilayer structure.

FIG. 3 is a cross section of a layered structure of wire(s) having the above multilayer structure. In this figure, the structure will be described using a driving power line 53 as an example. The driving power line 53 comprises a first protective layer 110 on the interlayer insulating film 15; a wiring layer 112 on the first protective layer 110; and the second protective layer 114 on the wiring layer 112. In the driving power line 53, the first alloy layer 116 and the second alloy layer 118 are formed between the first protective layer 110 and the wiring layer 112 and between the wiring layer 112 and the second protective layer 114, respectively.

The first protective layer 110 and the second protective layer 114 may be made of a metal whose lattice type is body centered cubic (bcc). The first protective layer 110 and the second protective layer 114 are preferably made of a Group 6A or 5A element such as chromium (Cr), molybdenum (Mo), tungsten (W), vanadium (V), niobium (Nb) and tantalum (Ta). In this embodiment, the first protective layer 110 and the second protective layer 114 are made of molybdenum.

The wiring layer 112 may be made of a metal with a different lattice type from that of the metal constituting the first protective layer 110 or the second protective layer 114. The wiring layer 112 may be, for example, made of a metal whose lattice type is face centered cube (fcc). The wiring layer 112 is preferably made of aluminum, or copper or silver having a lower resistance than aluminum. In this embodiment, the wiring layer 112 is made of aluminum.

Alternatively, the wiring layer 112 may contain a lanthanoid such as neodymium. A lanthanoid may be added to a low resistance metal such as aluminum to improve electromigration resistance of a layered structure of wire(s). In this embodiment, the wiring layer 112 is made of an aluminum-neodymium alloy (Nd—Al). In this embodiment, a neodymium content in the aluminum-neodymium alloy is 2 atomic %.

The first alloy layer 116 and the second alloy layer 118 may be made of an intermetallic compound of a metal constituting the refractory metal layer and a metal constituting the low resistance metal layer. In this embodiment, the first alloy layer 116 and the second alloy layer 118 is made of an intermetallic compound of the aluminum-neodymium alloy and molybdenum.

EXAMPLES

The present invention will be explained with reference to specific examples.

After forming an $SiO_2$ film as an interlayer insulating film to be a base, a contact hole was formed in the interlayer insulating film. Then, a layered structure of wire(s) was deposited on the interlayer insulating film using a load-lock (LL) type multi-chamber deposition apparatus. The deposition apparatus comprises an LL chamber, a handling chamber, a first sputtering chamber in which molybdenum is placed as a target and a second sputtering chamber in which an aluminum-neodymium alloy is placed as a target. A neodymium content in the aluminum-neodymium alloy is 2 atomic %.

First, the LL chamber, the handling chamber, the first sputtering chamber and the second sputtering chamber were pre-vacuumed to $10^{-3}$ Pa and a substrate was then carried from the LL chamber to the handling chamber. Opening a gate valve between the handling chamber and the first sputtering chamber, the substrate was carried into the first sputtering chamber and then heated to 100° C. Then, Ar gas was introduced into the first sputtering chamber to 0.23 Pa. Sputtering was conducted under the conditions of a power: 6.2 kW and a flow rate of Ar gas: 100 sccm to deposit the first protective layer made of molybdenum to 50 nm. Observation of a TEM (transmission electron microscopy photograph), which will be explained in the following, indicated that the first protective layer thus deposited adhered to the base interlayer insulating film with good adherence.

Again, the first sputtering chamber was vacuumed to $10^{-3}$ Pa, and the substrate was then carried to the second sputtering chamber via the handling chamber. Since the handling chamber, the first sputtering chamber and the second sputtering chamber are maintained in vacuum atmosphere, a next layer can be deposited without removing the substrate from the reduced-pressure atmosphere. The surface of the first protective layer can be, therefore, kept clean and adequately reactive.

In the second sputtering chamber, the substrate was heated to 100° C. Then, Ar gas was introduced into the second sputtering chamber to 0.41 Pa. Sputtering was conducted under the conditions of a power: 6.5 kW and a flow rate of Ar gas: 100 sccm to deposit a wiring layer made of an aluminum-neodymium alloy to 400 nm.

Again, the second sputtering chamber was vacuumed to $10^{-3}$ Pa, and the substrate was then carried to the first sputtering chamber via the handling chamber. In the first sputtering chamber, the substrate was heated to 100° C. Then, Ar gas was introduced into the first sputtering chamber to 0.23 Pa. Sputtering was conducted under the conditions of a power: 6.2 kW and a flow rate of Ar gas: 100 sccm to deposit the second protective layer made of molybdenum to 100 nm. In this example, a distance between the substrate and the target was 0.05 m in the first and the second sputtering chambers.

After patterning the multilayer structure thus formed, the substrate was heated at 350° C. for 30 min.

In the above example, the pressures in the first and the second sputtering chambers were 0.23 Pa and 0.41 Pa, respectively. The pressures in these sputtering chambers may be determined as follows. It is preferable to sputter particles such as high energy atoms or ions to the substrate for forming a stable layered structure of wire(s) by increasing the crystal grain size, and furthermore for consistently forming an intermediate phase. It is, therefore, needed that sputtered particles directly arrived at the substrate from the target without collision with other particles such as gaseous Ar. Specifically, it is preferable to reduce a particle collision parameter represented by $d/\lambda$ wherein d (in meters) is a distance between the substrate and the target and $\lambda$ is a mean free path of the particles, as much as possible.

A probability of collision is proportional to a cross-sectional area of a particle and a pressure P in a sputtering chamber. A mean free path is proportional to a particle velocity v and inversely proportional to a collision probability. Thus, the relationship can be represented by $\lambda \propto v/(P \times S)$. A velocity of each particle v is represented by $E=1/2 \times mv^2$, where m is a particle weight. Here, m may be expressed as $m \propto m$, where M is an atomic weight of a target metal although it is an average atomic weight or the smallest atomic weight in main metals when the target metal is an alloy, and an average energy of particles released from the target is constant at 5 to 10 eV independently of the type of the atom or the target. There is, therefore, a relationship, $v \propto (1/M)^{1/2}$. Thus, a mean free path $\lambda$ can be represented by $\lambda \propto 1/(M^{1/2} \times P \times S)$. In other words, when the distance d between the substrate and the target is constant, it is preferable to reduce a pressure in the sputtering chamber as much as possible. A cross-sectional area of a particle can be approximate to $\pi r^2$ where r is an atomic radius. Since an atomic radius r of a metal preferably used in this embodiment is constant at about 1.25 to 1.45 Å, S can be expressed as a constant.

As described above, a mean free path $\lambda$ can be represented by $\lambda \propto 1/(M^{1/2} \times P \times S)$ and can be controlled by varying a molecular weight M of each particle and a pressure P in a sputtering chamber. In other words, it is preferable that a pressure in a sputtering chamber is low and a pressure in the sputtering chamber should be lower for particles having a larger molecular weight M.

Since the particle collision parameter described above can be represented by $P \times M^{1/2} \times d$, reduction in a distance d between the substrate and the target can be similarly effective. In this embodiment, a distanced between the substrate and the target may be 0.1 m or less.

In this embodiment, a pressure P in the sputtering chamber may be selected such that a particle collision parameter $P \times M^{1/2} \times d$ is 0.18 or less. A pressure P in the sputtering chamber may be, therefore, $0.18/(M^{1/2} \times d)$ or less. Thus, a layered structure of wire(s) with a large crystal size can be consistently formed, and furthermore, an intermediate phase can be consistently formed. The lower limit for a pressure P in the sputtering chamber is preferably 0.1 Pa, whereby each layer can be consistently deposited.

A substrate temperature during sputtering may be 50° C. to 150° C. both inclusive. In addition, heating may be conducted at a temperature from the substrate temperature during sputtering to 450° C. both inclusive.

Figure 4:
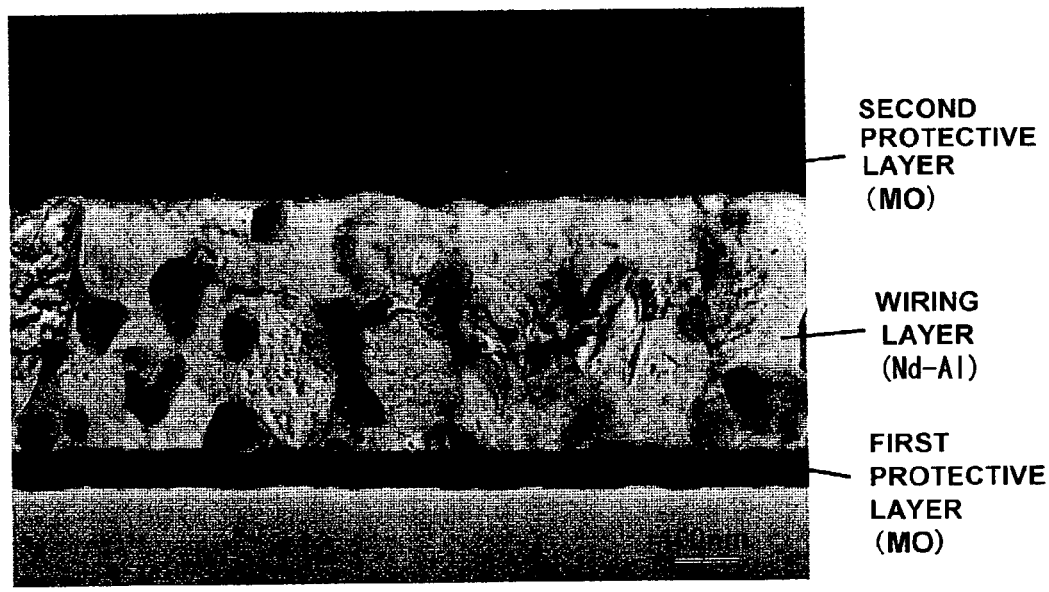
FIG. 4 shows a cross section (TEM photograph) of a driving power line.

FIG. 4 shows a cross section (TEM photograph) of the driving power line 53 as described above. As seen in this figure, crystal particles of an aluminum-neodymium alloy were formed in the wiring layer.

Figure 5:
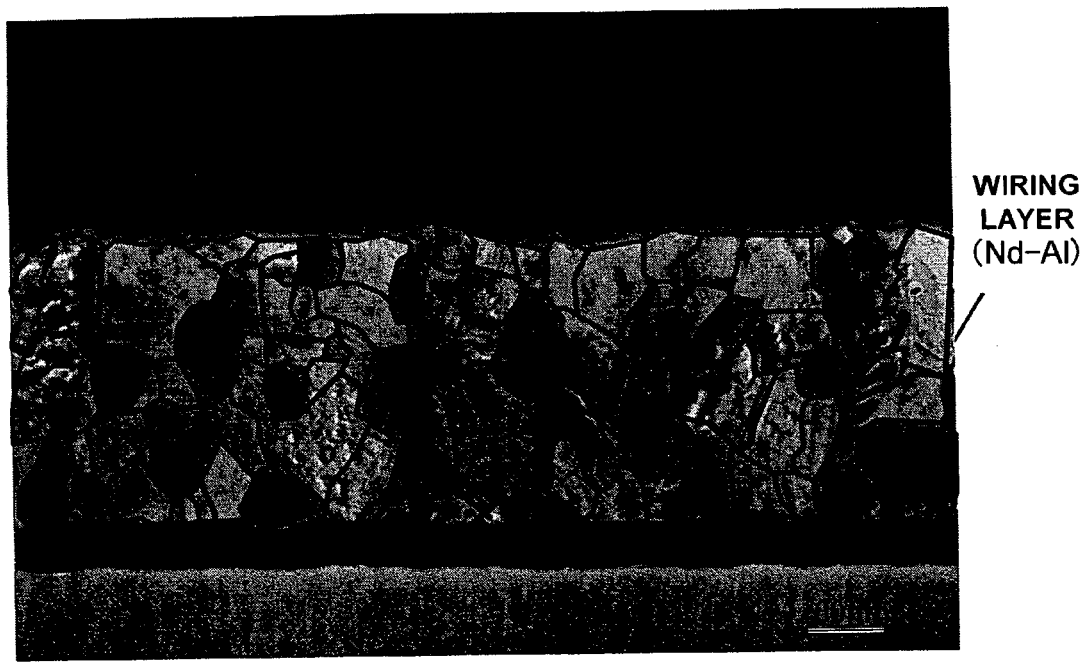
FIG. 5 shows boundaries for individual crystal particles (grains) in the cross section shown in FIG. 4.
Figure 6A:
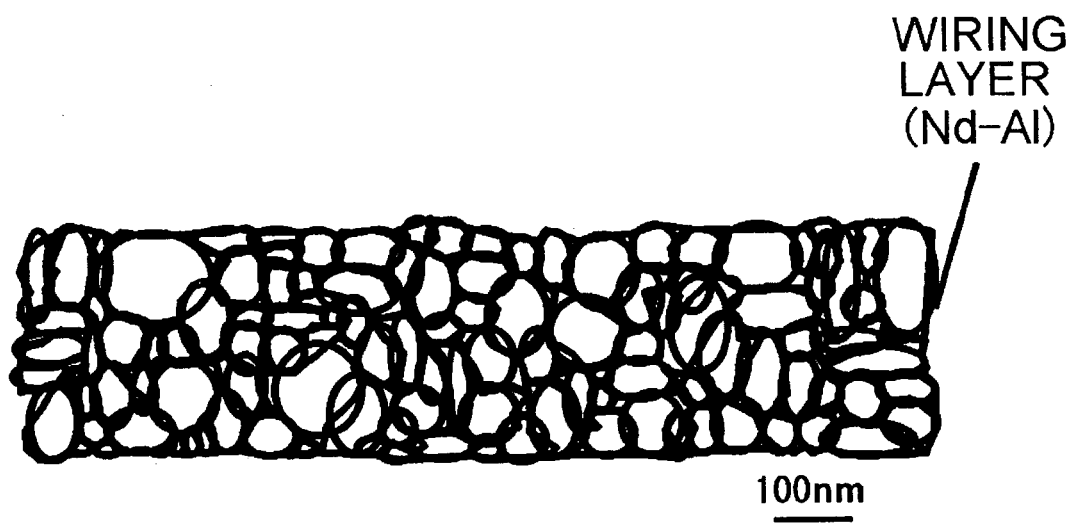
FIG. 6A shows ellipses approximating the boundaries illustrated in FIG. 5.
Figure 6B:
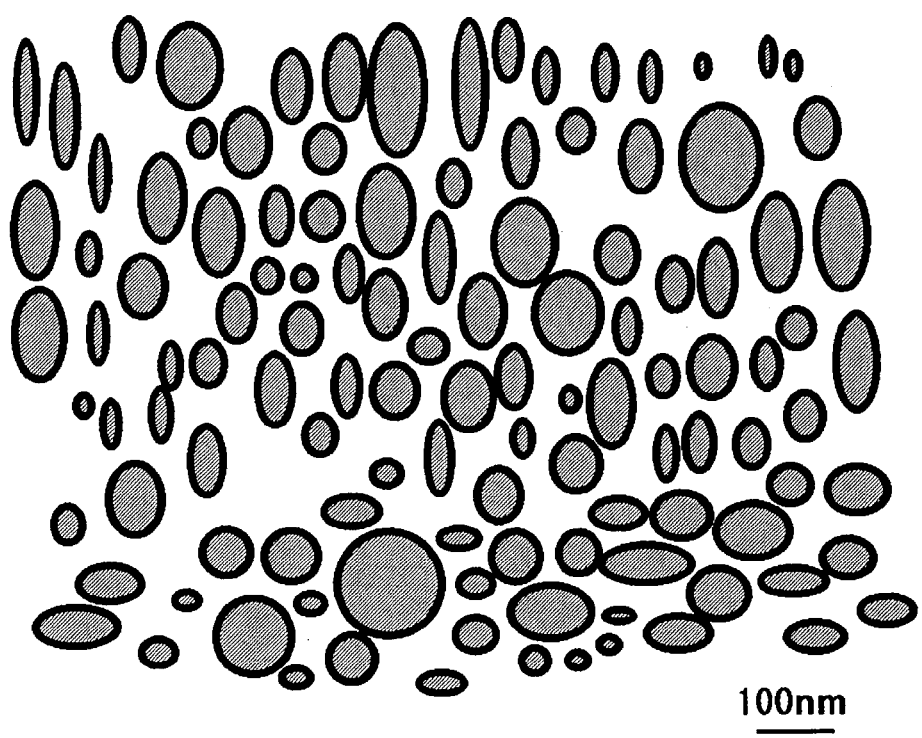
FIG. 6B shows the extracted approximating ellipses illustrated in FIG. 6A.
Figures 7A, 7B:
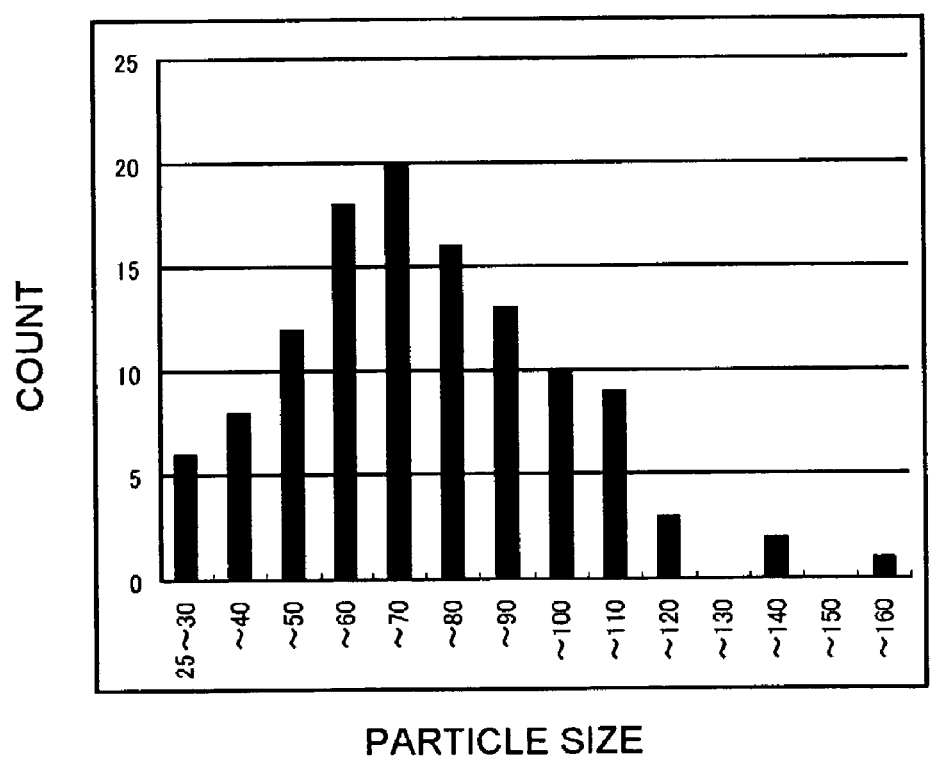
FIG. 7A shows crystal grain sizes for the crystals illustrated in the cross section of FIG. 4.
FIG. 7B shows crystal grain sizes for the crystals illustrated in the cross section of FIG. 4.

FIG. 5 shows boundaries of crystal particles (grains) in the cross section in FIG. 4. With reference to this figure, crystal particles are approximated to ellipses as seen in FIG. 6A. In FIG. 6B, ellipses from such approximation are extracted. FIGS. 7A and 7B show crystal grain sizes of the crystals in the cross section in FIG. 4. FIG. 7A shows a relationship between crystal grain sizes and their numbers while FIG. 7B graphically shows the relationship. A size of each particle was determined by calculating an average of a long and a short axes in a corresponding ellipse in FIG. 6B. Few particles with a size of less than 25 nm were observed in cross section in FIG. 4 and were, therefore, neglected in evaluation.

As seen in FIGS. 7A and 7B, major particles are those with a size of 60 nm to 70 nm. In these figures, 112 of the total 118 extracted ellipses have a crystal grain size of more than 30 nm and account for about 95% (112/118×100). Similarly, 74 ellipses have a crystal grain size of more than 60 nm and account for about 62% (74/118×100). A number average crystal grain size of the crystals is 69.55 nm, which is calculated by dividing the total of the sizes of the particles from the ellipses illustrated in FIG. 6B (8207.9 nm) by the total particle number (118) as described above. Furthermore, few particles with a size of less than 25 nm were formed. In other words, the method of manufacturing the layered structure of wire(s) according to the present invention provided a layered structure of wire(s) comprised of crystal particles of an aluminum-neodymium alloy having a size of more than 16.9 nm which is a mean free path of electrons in aluminum.

The layered structure of wire(s) thus formed had a specific resistance of 15 μΩcm immediately after deposition, and 4.8 μΩcm after heating at 350° C. for 30 minutes.

As a reference example, a layered structure of wire(s) was formed using an aluminum-neodymium alloy with a neodymium content of 2 atomic % as a target under the conditions of a substrate temperature: 100° C., a pressure in the second sputtering chamber: 0.70 Pa and an argon flow rate: 200 sccm. In this case, the layered structure of wire(s) had a specific resistance of 21.5 μΩcm immediately after deposition. This reference example also indicates that a resistance was reduced in the layered structure of wire(s) formed according to the process in the above example. Furthermore, the above results also indicate that a resistance in a layered structure of wire(s) can be sufficiently reduced at a sputtering chamber pressure P of less than $0.18/(M^{1/2} \times d)$, and thus imply that the crystals could have a large crystal grain size under such conditions.

In the above embodiment, the layered structure of wire(s) has a multilayer structure where on the wiring layer 112 made of a low resistance metal are deposited the first alloy layer 116, the first protective layer 110, the second alloy layer 118 and the second protective layer 114. In terms of increasing a crystal size, the first alloy layer 116, the first protective layer 110, the second alloy layer 118 or the second protective layer 114 are not essential.

Figure 8A:
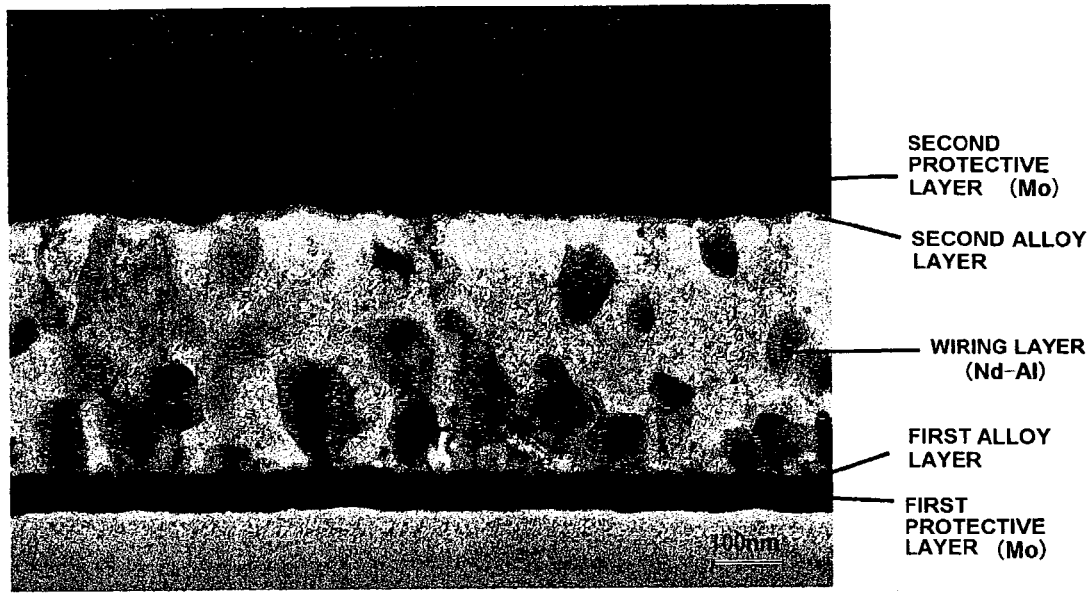
FIG. 8A shows a cross section (TEM photograph) of a layered structure of wire(s).
Figure 8B:
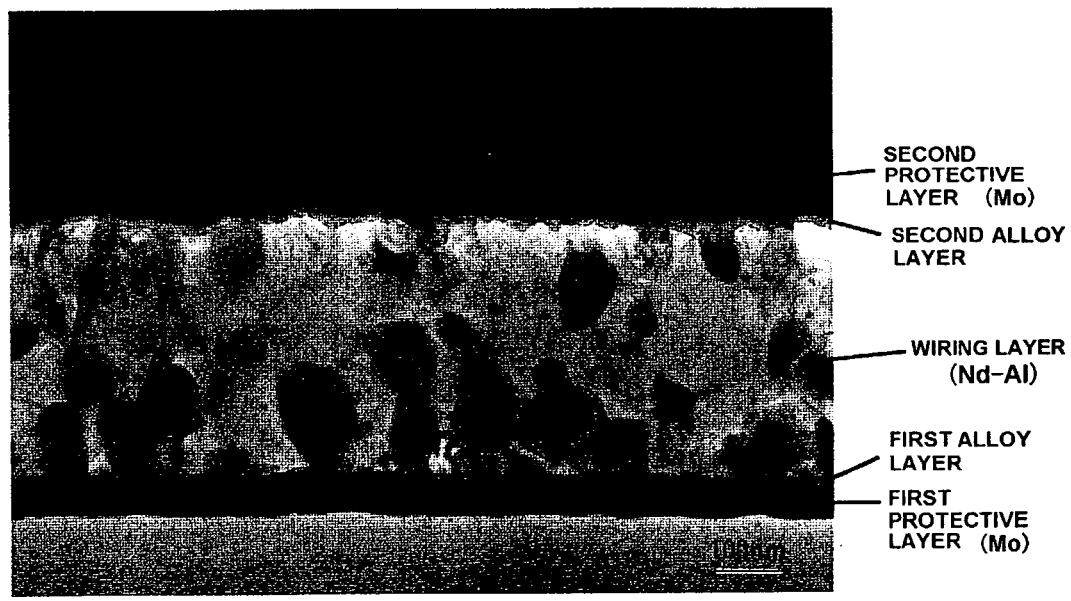
FIG. 8B shows the TEM photograph of FIG. 8A indicating the boundaries between the first alloy layer and the wiring layer and between the second alloy layer and the wiring layer with broken lines.

FIGS. 8A and 8B show another cross section (TEM photograph) of the driving power line 53 as described above. As seen in FIG. 8A, the first and the second alloy layers were substantially uniformly formed between the first protective layer and the wiring layer and between the wiring layer and the second protective layer, respectively. In FIG. 8B, boundaries between the first alloy layer and the wiring layer and between the second alloy layer and the wiring layer are indicated by broken lines.

Figure 9A:
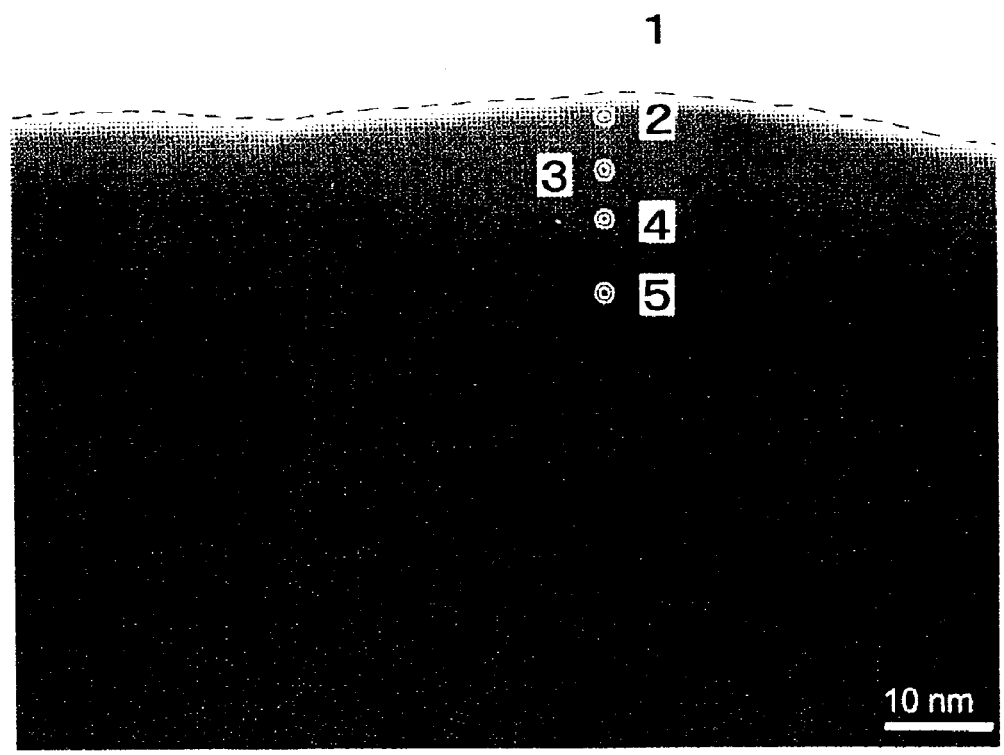
FIG. 9A is a cross-section showing a region in the vicinity of the second alloy layer.
Figure 9B:
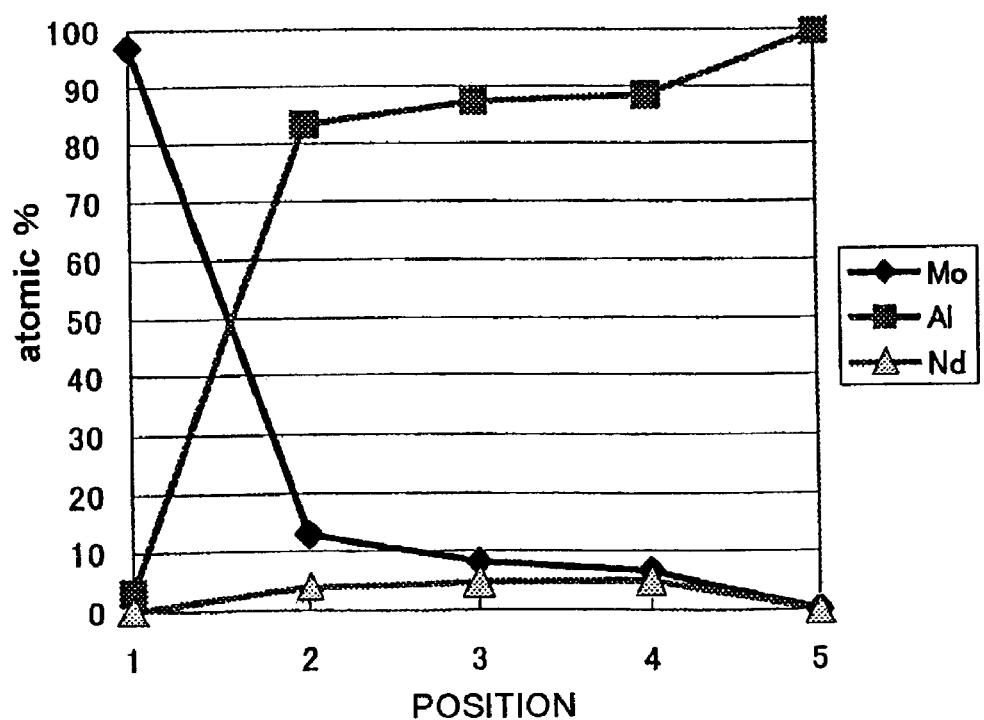
FIG. 9B shows the results of measurement of a metal composition in an alloy layer by energy dispersive X-ray spectroscopy.

FIGS. 9A and 9B show the results of measuring a metal composition in the second alloy layer by energy dispersive X-ray spectroscopy (EDS). FIG. 9A shows a cross section near the second alloy layer while FIG. 9B shows a metal composition at each position indicated in FIG. 9A. As seen in FIG. 9B, the second alloy layer region has an aluminum content of about 80 to 90 atomic %, a molybdenum content of about 7 to 15 atomic % and a neodymium content of about 1~4 atomic %.

In the TEM photograph in FIG. 8A, there is a clear contrast between the first and the second alloy layers. It is, therefore, strongly implied that in the first and the second alloy layers, respectively, there is formed an intermediate phase having a different crystal structure from those in the first protective layer, the wiring layer and the second protective layer formed over/under the alloy layers. If such an intermediate phase is not formed, the same crystal structures as the metal crystal structures in these alloy layers are mixed in an interface between the layers so that such a good contrast cannot be obtained in a TEM photograph. It also confirms formation of the intermediate phase. The EDS measurement results indicate coexistence of aluminum, molybdenum and neodymium in the intermediate phase region, and thus indicate formation of an intermediate phase of these metals, i.e., an intermetallic compound.

Figure 10:
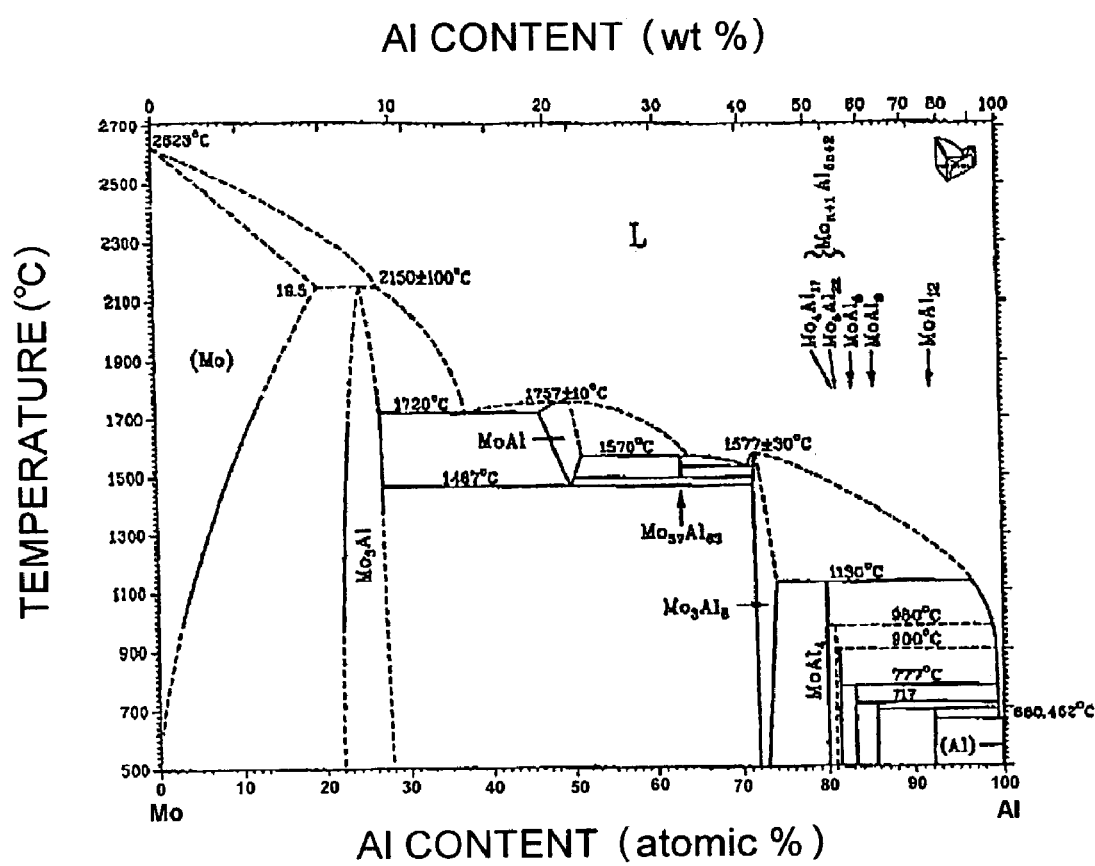
FIG. 10 shows a binary phase diagram for aluminum and molybdenum.

FIG. 10 shows a binary phase diagram for aluminum and molybdenum ("Binary Alloy Phase Diagrams Volume 1", Thaddeus B. Massalski, American Society for Metals). As shown in this figure, an intermetallic compound of aluminum and molybdenum may be, for example, Mo3Al, MoAl, Mo37Al63, Mo3Al8, MoAl4, Mo4Al17, Mo5Al22, MoAl5, MoAl6 or MoAl12, and so on. These results imply that one of these intermetallic compounds are formed in the first alloy layer 116 and the second alloy layer 118. Furthermore, since the wiring layer 112 is made of an aluminum-neodymium alloy in this embodiment, an intermetallic compound containing neodymium could be formed.

The driving power line 53 thus formed exhibited good adherence in the subsequent processing as well as improved resistance to whiskers/hillocks, electromigration and stress migration.

As a reference example, a layered structure of wire(s) was formed as described above, except that deposition was conducted at room temperature (about 23° C.) without heating a substrate. Observation of a cross section by TEM indicated that the layered structure of wire(s) was lifted during the subsequent processing.

As another reference example, deposition was conducted under the conditions of a pressure in the first sputtering chamber: about 0.40 Pa and a pressure in the second sputtering chamber: about 0.70 Pa. Again, observation of a cross section by TEM indicated that the layered structure of wire(s) was lifted during the subsequent processing. The results in these reference examples also confirm that in the layered structure of wire(s) formed according to this embodiment, adherence between the wiring layer and the protective layer was improved. These results also imply that an intermediate phase could be consistently formed when a pressure P in the sputtering chamber is $0.18/(M^{1/2} \times d)$ or less.

Although the present invention has been described by way of exemplary embodiments, it should be understood that many changes and substitutions may further be made by those skilled in the art without departing from the scope of the present invention which is defined by the appended claims.

What is claimed is:

1. An optical apparatus, comprising
   a circuit comprising a current driven optical element, and
   a layered structure of wire(s) connected to said circuit,
   wherein said layered structure of wire(s) comprises
   a wiring layer made of a metal containing at least one of aluminum, copper and silver,
   an alloy layer made of an intermediate phase containing the metal constituting said wiring layer and a refractory metal which is adjacent to said wiring layer, and
   a protective layer made of the refractory metal, wherein the alloy layer is formed between said wiring layer and said protective layer such that said alloy layer is adjacent to said wiring layer and said protective layer.

2. An optical apparatus according to claim 1, wherein said wiring layer in said layered structure of wire(s) is made of an aluminum alloy containing a lanthanoid and an average crystal grain size is 16.9 nm or more.

3. An optical apparatus according to claim 1, comprising a plurality of said circuits wherein said layered structure of wire(s) is connected to said plurality of circuits to be used as a power line for supplying a power for each of said circuits.

4. An optical apparatus, comprising
a circuit comprising a current driven optical element, and
a layered structure of wire(s) connected to said circuit, wherein said layered structure of wire(s) is made of an aluminum alloy containing a lanthanoid, wherein an average crystal grain size is 16.9 nm or more.

5. An optical apparatus according to claim 4, comprising a plurality of said circuits wherein said layered structure of wire(s) is connected to said plurality of circuits to be used as a power line for supplying a power for each of said circuits.

* * * * *